(12) United States Patent
Kitabayashi et al.

(10) Patent No.: US 11,784,156 B2
(45) Date of Patent: Oct. 10, 2023

(54) SEMICONDUCTOR DEVICE

(71) Applicant: Mitsubishi Electric Corporation, Tokyo (JP)

(72) Inventors: Takuya Kitabayashi, Tokyo (JP); Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 17/373,259

(22) Filed: Jul. 12, 2021

(65) Prior Publication Data

US 2022/0102312 A1  Mar. 31, 2022

(30) Foreign Application Priority Data

Sep. 30, 2020 (JP) ................ 2020-165305

(51) Int. Cl.
*H01L 23/00* (2006.01)
*H01L 23/373* (2006.01)
(Continued)

(52) U.S. Cl.
CPC ............ *H01L 24/48* (2013.01); *H01L 23/049* (2013.01); *H01L 23/3735* (2013.01);
(Continued)

(58) Field of Classification Search
CPC ... H01L 24/48; H01L 23/049; H01L 23/3735; H01L 24/32; H01L 24/73; H01L 25/072; H01L 25/18; H01L 2224/32225; H01L 2224/48175; H01L 2224/48225; H01L 2224/48465; H01L 2224/73265; H01L 2924/10254; H01L 2924/10272; H01L 2924/1033; H01L 2924/12032;
(Continued)

(56) References Cited

U.S. PATENT DOCUMENTS

2015/0214126 A1\* 7/2015 Kim ................ H01L 24/49
361/717
2020/0119179 A1\* 4/2020 Mishra ............. H01L 29/205

FOREIGN PATENT DOCUMENTS

JP  H07-058272 A  3/1995
JP  H08-078619 A  3/1996
(Continued)

OTHER PUBLICATIONS

An Office Action; "Notice of Reasons for Refusal," mailed by the Japanese Patent Office dated Aug. 1, 2023, which corresponds to Japanese Patent Application No. 2020-165305 and is related to U.S. Appl. No. 17/373,259; with English language translation.

*Primary Examiner* — Elias Ullah
(74) *Attorney, Agent, or Firm* — Studebaker & Brackett PC

(57) ABSTRACT

A semiconductor device includes: an insulating substrate; a first semiconductor element connected to the insulating substrate; a conductive member disposed on the insulating substrate, and including a first opposing portion and a second opposing portion located opposite each other with respect to the first semiconductor element in plan view; a first wire connected to the first semiconductor element and the first opposing portion; and a second wire connected to the first semiconductor element and the second opposing portion, and located opposite the first wire with respect to a connection point where the first wire and the first semiconductor element are connected to each other in plan view.

10 Claims, 10 Drawing Sheets

(51) Int. Cl.
    *H01L 25/07*     (2006.01)
    *H01L 25/18*     (2023.01)
    *H01L 23/049*    (2006.01)
(52) U.S. Cl.
    CPC .............. *H01L 24/32* (2013.01); *H01L 24/73* (2013.01); *H01L 25/072* (2013.01); *H01L 25/18* (2013.01); *H01L 2224/32225* (2013.01); *H01L 2224/48175* (2013.01); *H01L 2224/48225* (2013.01); *H01L 2224/48465* (2013.01); *H01L 2224/73265* (2013.01); *H01L 2924/1033* (2013.01); *H01L 2924/10254* (2013.01); *H01L 2924/10272* (2013.01); *H01L 2924/12032* (2013.01); *H01L 2924/12036* (2013.01); *H01L 2924/13055* (2013.01); *H01L 2924/13091* (2013.01); *H01L 2924/16196* (2013.01); *H01L 2924/1715* (2013.01)
(58) Field of Classification Search
    CPC . H01L 2924/12036; H01L 2924/13055; H01L 2924/13091; H01L 2924/16196; H01L 2924/1715; H01L 24/29; H01L 2224/29101; H01L 2224/83801; H01L 24/49; H01L 2924/00014; H01L 23/053; H01L 23/24; H01L 23/5386; H01L 23/49811; H01L 2224/0603; H01L 2224/48091; H01L 2224/48096; H01L 2224/48111; H01L 2224/48139; H01L 2224/48227; H01L 2224/49109; H01L 2224/49111; H01L 2224/49113; H01L 2224/4917; H01L 2224/49175; H01L 2924/181; H01L 2924/19107
    See application file for complete search history.

(56) References Cited

FOREIGN PATENT DOCUMENTS

| | | |
|---|---|---|
| JP | 2009-206140 A | 9/2009 |
| JP | 2015-076511 A | 4/2015 |
| JP | 2017-107937 A | 6/2017 |
| JP | 2018-186302 A | 11/2018 |

* cited by examiner

SEMICONDUCTOR DEVICE

BACKGROUND OF THE INVENTION

Field of the Invention

The present disclosure relates to semiconductor devices.

Description of the Background Art

Recent miniaturization of semiconductor elements and reduction in surface area of a semiconductor element sometimes make it difficult to bond a sufficient number of wires onto a semiconductor element, resulting in an increase in current density per wire. Heat generation of a wire caused by the increase in current density might impair reliability of a semiconductor device. Various techniques for solving such a problem have been proposed. For example, Japanese Patent Application Laid-Open No. 2009-206140 proposes a technique of bonding twice the normal number of wires onto a semiconductor element by stitch-bonding a wire onto a bus bar, the semiconductor element, and the bus bar.

In the technique proposed by Japanese Patent Application Laid-Open No. 2009-206140, however, an insulating layer to which the bus bar is provided is spaced apart from the semiconductor element. With such a configuration, the insulating layer is required to have a relatively large size to prevent displacement of the bus bar from an upper portion of the insulating layer. This results in a problem in that miniaturization of semiconductor devices is difficult.

SUMMARY

The present disclosure has been conceived in view of a problem as described above, and it is an object to provide a technique allowing for miniaturization of semiconductor devices.

A semiconductor device according to the present disclosure includes: an insulating substrate; a first semiconductor element connected to the insulating substrate; a conductive member disposed on the insulating substrate, and including a first opposing portion and a second opposing portion located opposite each other with respect to the first semiconductor element in plan view and electrically connected to each other; a first wire connected to the first semiconductor element and the first opposing portion; and a second wire connected to the first semiconductor element and the second opposing portion, and located opposite the first wire with respect to a connection point where the first wire and the first semiconductor element are connected to each other in plan view.

The semiconductor device can be miniaturized.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below with reference the accompanying drawings. Features described in each of the embodiments below are examples, and all the features are not necessary features. In description made below, components similar in a plurality of embodiments bear the same or similar reference signs, and description is made mainly on a different component. In description made below, specific locations and directions indicated by "upper", "lower", "left", "right", "front", "back", and the like do not necessarily match directions in actual use.

Embodiment 1

Figure 1:
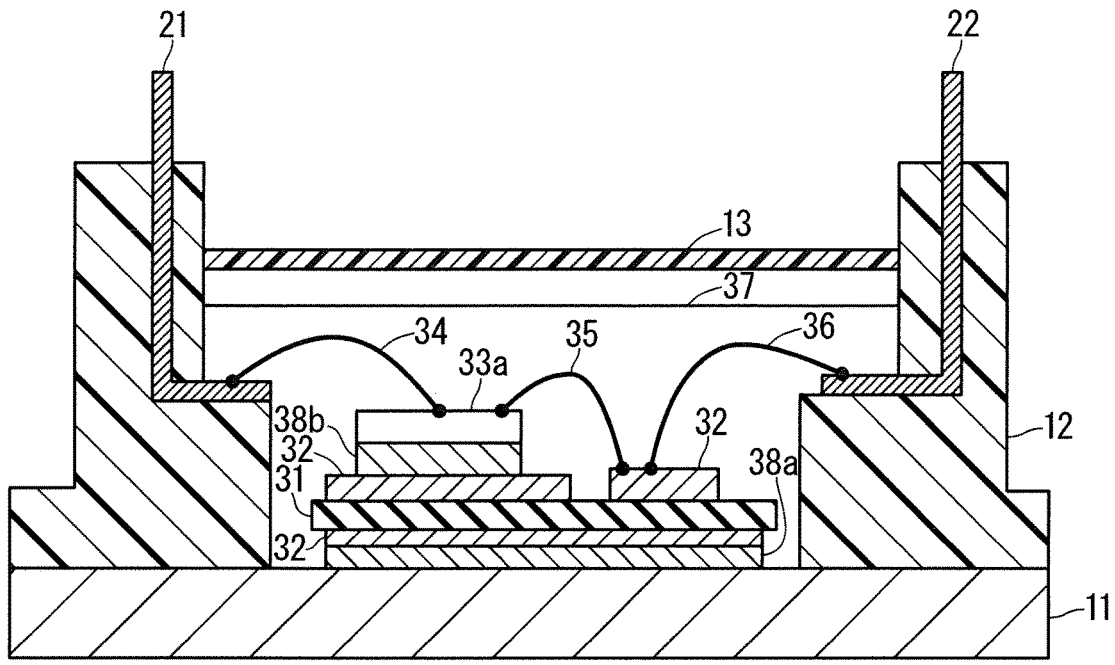
FIG. 1 is a cross-sectional view illustrating a schematic configuration of a semiconductor device according to Embodiment 1.

Description will be made below based on the assumption that a semiconductor device according to Embodiment 1 is a semiconductor module. FIG. 1 is a cross-sectional view illustrating a schematic configuration of the semiconductor device according to Embodiment 1. FIG. 1 illustrates the schematic configuration of the semiconductor device, and thus slightly differs from FIG. 2 and subsequent drawings.

The semiconductor device in FIG. 1 includes a base plate 11, a case 12, a lid 13, an external control terminal 21, an external connection terminal 22, an insulating substrate 31, a plurality of circuit patterns 32, a first semiconductor element 33a, a control wire 34, an emitter wire 35, a connection wire 36, and a sealing member 37. As with the first semiconductor element 33a, the semiconductor device includes a second semiconductor element 33b, although the second semiconductor element 33b is not illustrated in FIG. 1.

The case 12 is disposed on the base plate 11 made of metal, such as copper, and surrounds a portion of the base plate 11. The base plate 11 and the case 12 constitute a container body containing the first semiconductor element 33a and the like in an internal space. The lid 13 blocks an opening of the case 12 to seal the internal space of the container body.

The external control terminal 21 and the external connection terminal 22 are each formed of a metal plate, for example. One end of the external control terminal 21 is located external to the case 12, and is connected to the exterior (e.g., an external terminal) of the semiconductor device. The other end of the external control terminal 21 is located internal to the case 12, that is, in the internal space of the container body, and is connected to a component internal to the semiconductor device. Similarly, one end of the external connection terminal 22 is located external to the case 12, and the other end of the external connection terminal 22 is located internal to the case 12.

The circuit patterns 32 made of metal are arranged on an upper surface and a lower surface of the insulating substrate 31. A plurality of circuit patterns 32 spaced apart from one another are arranged on the upper surface of the insulating substrate 31. The insulating substrate 31 is connected to the portion of the base plate 11 surrounded by the case 12 through a circuit pattern 32 on the lower surface of the insulating substrate 31 and solder 38a.

The first semiconductor element 33a is connected to the insulating substrate 31 through the circuit patterns 32 on the upper surface and solder 38b. The first semiconductor element 33a is a semiconductor switching element, such as an insulated gate bipolar transistor (IGBT) and a metal oxide semiconductor field effect transistor (MOSFET).

The control wire 34 connects a portion of the external control terminal 21 located in the internal space and a control electrode (e.g., gate electrode) disposed on the first semiconductor element 33a. The emitter wire 35 connects a controlled electrode (e.g., an emitter electrode) disposed on the first semiconductor element 33a and a circuit pattern 32. The connection wire 36 connects the circuit pattern 32 to which the emitter wire 35 is connected and a portion of the external connection terminal 22 located in the internal space.

The sealing member 37 is a gel, for example, and seals the insulating substrate 31, the plurality of circuit patterns 32, the first semiconductor element 33a, the control wire 34, the emitter wire 35, the connection wire 36, and the like.

Figure 2:
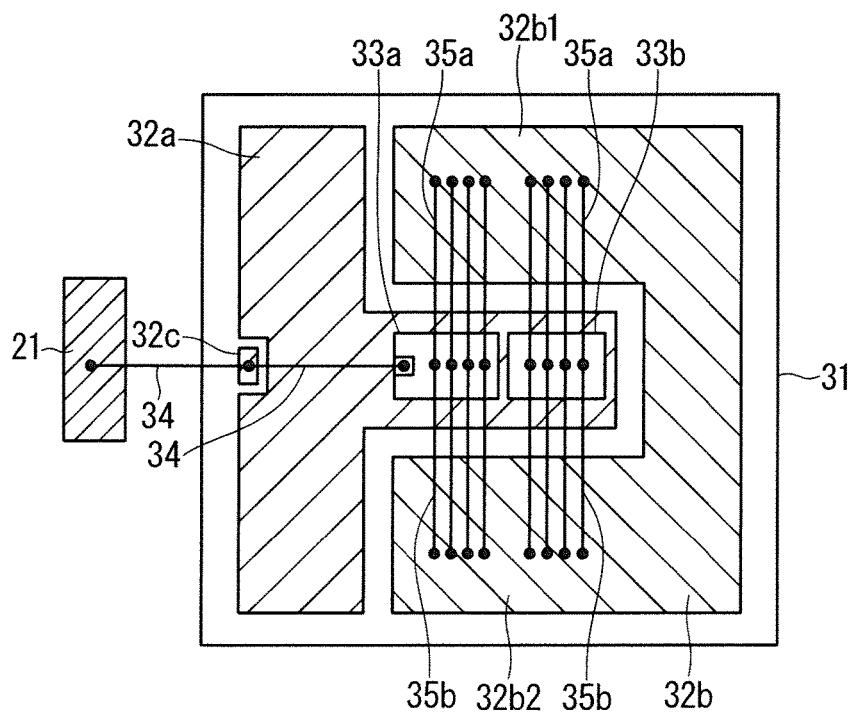
FIG. 2 is a plan view illustrating a configuration of the semiconductor device according to Embodiment 1.
Figure 3:
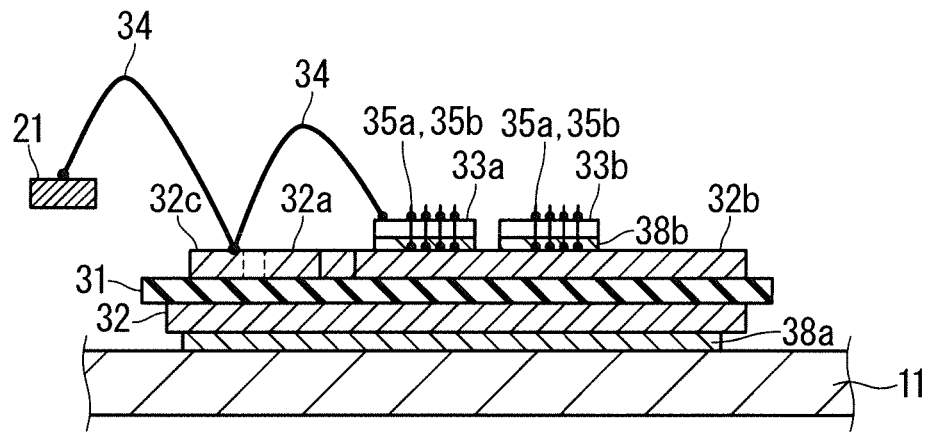
FIG. 3 is a side view illustrating a configuration of the semiconductor device according to Embodiment 1.

FIG. 2 is a plan view illustrating a configuration of the semiconductor device according to Embodiment 1, and FIG. 3 is a side view illustrating a configuration of the semiconductor device according to Embodiment 1. A portion of the configuration in FIG. 1 is illustrated in each of FIGS. 2 and 3.

The circuit patterns 32 on the upper surface of the insulating substrate 31 in FIG. 1 include a collector pattern 32a, an emitter pattern 32b, and a control pattern 32c in FIG. 2. For example, wet etching allowing for formation of a pattern having a width of approximately 1 mm is used to form the circuit patterns 32 including the collector pattern 32a, the emitter pattern 32b, and the control pattern 32c.

The collector pattern 32a is a circuit pattern 32 connected to the first semiconductor element 33a through the solder 38b. As with the first semiconductor element 33a, the second semiconductor element 33b connected to the collector pattern 32a through the solder 38b is illustrated in FIG. 2. The second semiconductor element 33b is a diode, such as a PN junction diode (PND) and a Schottky barrier diode (SBD).

The emitter pattern 32b is a conductive member including a first opposing portion 32b1 and a second opposing portion 32b2. The first opposing portion 32b1 and the second opposing portion 32b2 are located opposite each other with respect to the first semiconductor element 33a in plan view. The second opposing portion 32b2 is located directly opposite the first opposing portion 32b1 with respect to the first semiconductor element 33a in the example of FIG. 2, but the location is not limited to this location as will be described below. The first opposing portion 32b1 and the second opposing portion 32b2 are electrically connected to each other, and have the same potential.

The control pattern 32c is connected only to the control wire 34 between the external control terminal 21 and the first semiconductor element 33a.

The emitter wire 35 in FIG. 1 includes a first emitter wire 35a as a first wire and a second emitter wire 35b as a second wire in FIG. 2.

The first emitter wire 35a is connected to the controlled electrode on the first semiconductor element 33a and the first opposing portion 32b1. The second emitter wire 35b is connected to the controlled electrode on the first semiconductor element 33a and the second opposing portion 32b2.

As illustrated in FIG. 2, the second emitter wire 35b is located opposite the first emitter wire 35a with respect to a connection point where the first emitter wire 35a and the first semiconductor element 33a are connected to each other in plan view. In Embodiment 1, a direction of extension of the first emitter wire 35a and a direction of extension of the second emitter wire 35b form a straight angle (an angle of 180°) in plan view. As will be described in Embodiment 7, however, the direction of extension of the first emitter wire 35a and the direction of extension of the second emitter wire 35b may form an obtuse angle (an angle more than 90° and less than 180°) in plan view.

The first emitter wire 35a and the second emitter wire 35b are a single stitch-bonded wire in the example of FIG. 2, but the first emitter wire 35a and the second emitter wire 35b are not limited to the single stitch-bonded wire, and may be separated from each other.

As with the first semiconductor element 33a, the second semiconductor element 33b is connected to the first opposing portion 32b1 with the first emitter wire 35a, and is connected to the second opposing portion 32b2 with the second emitter wire 35b.

Figure 4:
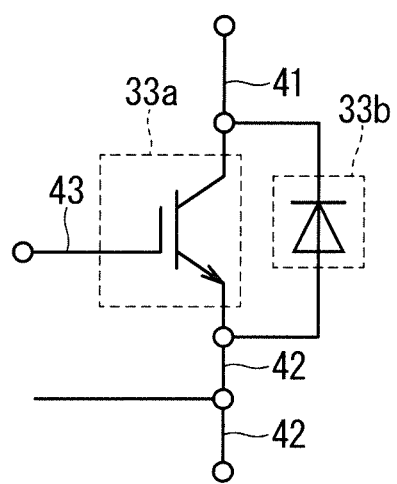
FIG. 4 is a circuit diagram showing a configuration of the semiconductor device according to Embodiment 1.

FIG. 4 is a circuit diagram corresponding to the configuration of FIG. 2. The diode as the second semiconductor element 33b is connected in parallel with the semiconductor switching element as the first semiconductor element 33a, and functions as a freewheeling diode.

Collector wiring 41 in FIG. 4 corresponds to the collector pattern 32a in FIG. 2. Emitter wiring 42 in FIG. 4 corresponds to the emitter pattern 32b, the first emitter wire 35a, and the second emitter wire 35b in FIG. 2. Control wiring 43 in FIG. 4 corresponds to the control pattern 32c and the control wire 34 in FIG. 2.

Summary of Embodiment 1

According to the semiconductor device according to Embodiment 1 as described above, the second emitter wire 35b is located opposite the first emitter wire 35a with respect to the connection point where the first emitter wire 35a and the first semiconductor element 33a are connected to each other in plan view. According to such a configuration, a wire can be bonded to the emitter pattern 32b, the first semiconductor element 33a, and the emitter pattern 32b, which are arranged substantially in a straight line, in the stated order. The wire can thus be bonded even when a sufficient number of wires cannot be bonded to the first semiconductor element 33a in a normal case. The number of wires and heat generation of a wire can be maintained without increasing the size of the semiconductor device, so that reliability of wiring can be improved.

In Embodiment 1, the emitter pattern 32b is disposed on the insulating substrate 31 to which the first semiconductor element 33a is connected. This can reduce a space for insulation between the first semiconductor element 33a and the emitter pattern 32b in plan view, so that the semiconductor device can be miniaturized. Furthermore, the layout of the emitter pattern 32b can easily be changed, so that versatility in the manufacture of the semiconductor device can be increased.

The semiconductor device according to Embodiment 1 includes the control pattern 32c, but may not include the control pattern 32c. A degree of freedom of a design layout, however, can be increased by including the control pattern 32c, so that further miniaturization of the semiconductor device can be expected. The semiconductor device according to Embodiment 1 includes the second semiconductor element 33b, but may not include the second semiconductor element 33b.

Embodiment 2

Figure 5:
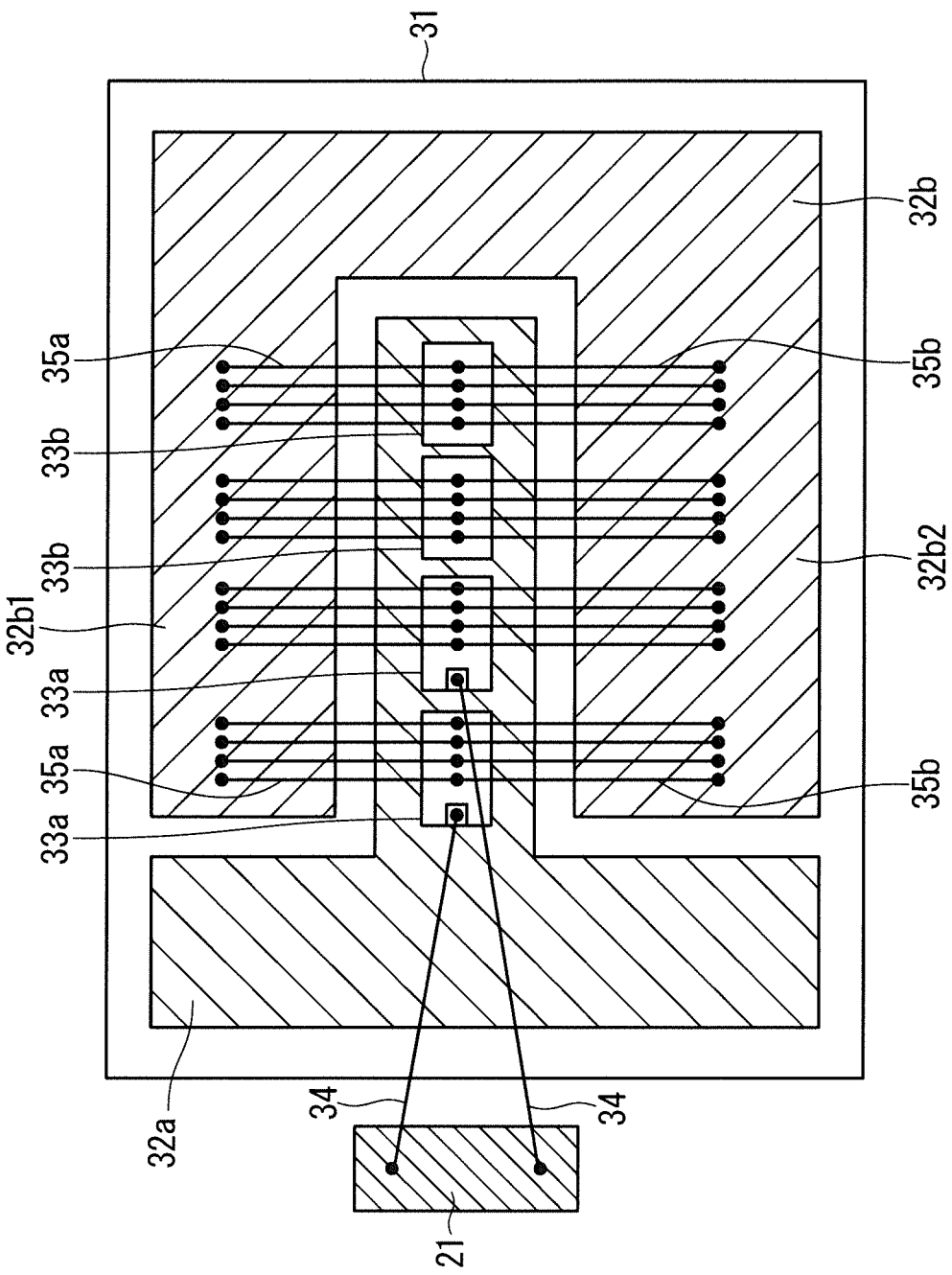
FIG. 5 is a plan view illustrating a configuration of a semiconductor device according to Embodiment 2.

FIG. 5 is a plan view illustrating a configuration of a semiconductor device according to Embodiment 2, and corresponds to FIG. 2.

As illustrated in FIG. 5, the semiconductor device according to Embodiment 2 includes a plurality of first semiconductor elements 33a and a plurality of second semiconductor elements 33b, but does not include the control pattern 32c.

Each of the plurality of first semiconductor elements 33a is connected to the emitter pattern 32b with the first emitter wire 35a and the second emitter wire 35b as with the first semiconductor element 33a in Embodiment 1. The plurality of first semiconductor elements 33a are thereby connected in parallel with one another with a plurality of first emitter wires 35a, a plurality of second emitter wires 35b, and the emitter pattern 32b, and thus can be driven in parallel with one another. Similarly, the plurality of second semiconductor elements 33b are connected in parallel with one another with a plurality of first emitter wires 35a, a plurality of second emitter wires 35b, and the emitter pattern 32b.

According to the semiconductor device according to Embodiment 2 as described above, the plurality of first semiconductor elements 33a can be driven in parallel with one another, so that an increase in capacity of the semiconductor device can be expected.

Embodiment 3

Figure 6:
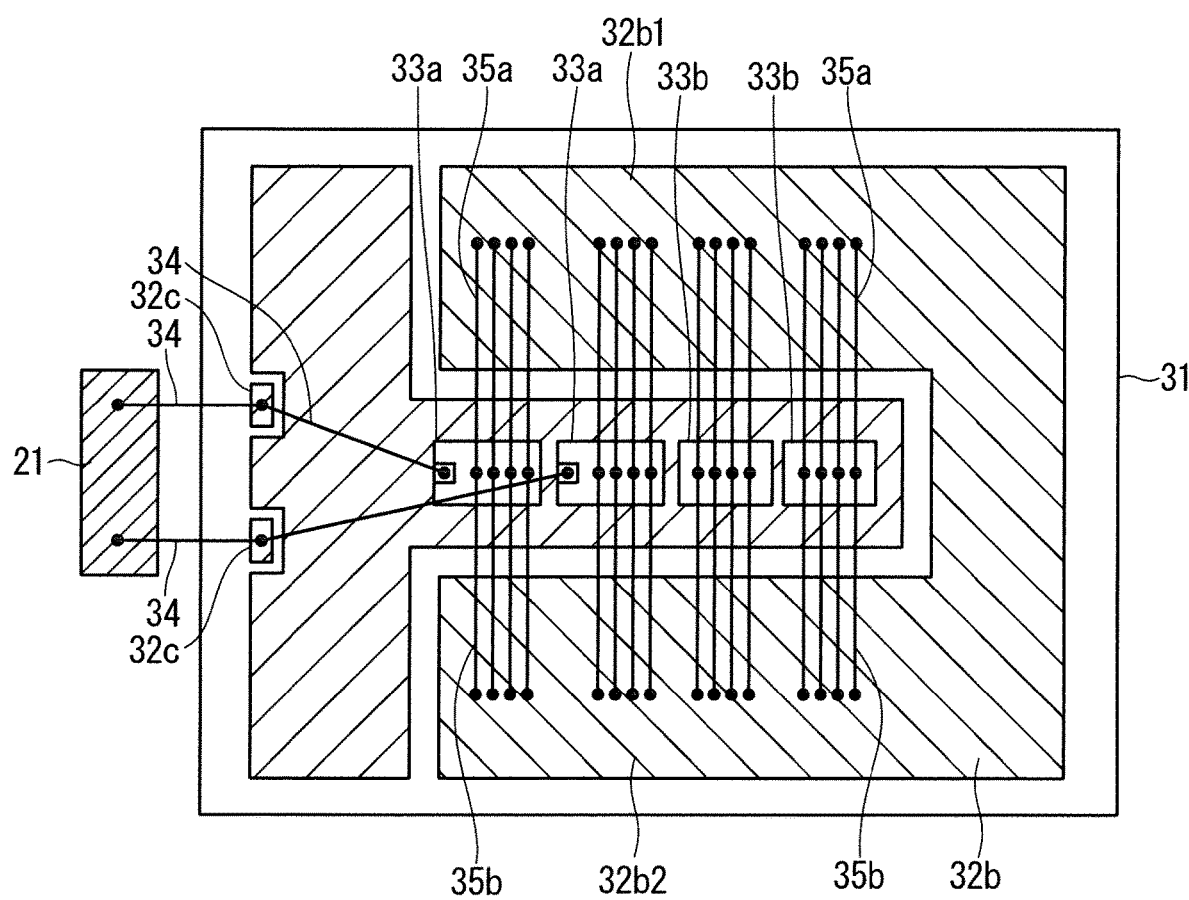
FIG. 6 is a plan view illustrating a configuration of a semiconductor device according to Embodiment 3.
Figure 7:
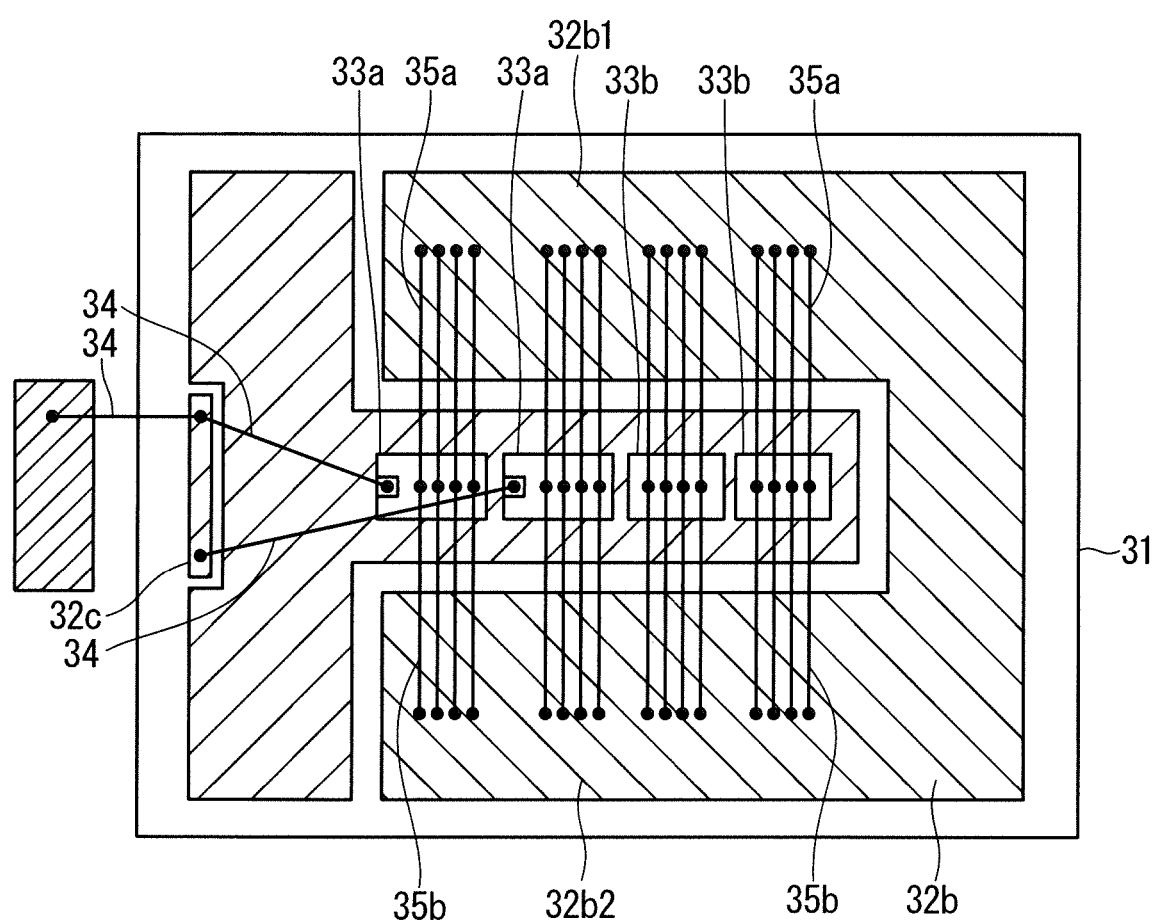
FIG. 7 is a plan view illustrating a configuration of the semiconductor device according to Embodiment 3.

FIGS. 6 and 7 are plan views each illustrating a configuration of a semiconductor device according to Embodiment 3, and correspond to FIG. 2.

The configuration in Embodiment 3 is similar to the configuration in Embodiment 2 in FIG. 5 to which the control pattern 32c has been added. The plurality of first semiconductor elements 33a may be provided with respective control patterns 32c as illustrated in FIG. 6, or the plurality of first semiconductor elements 33a may share a single control pattern 32c as illustrated in FIG. 7. According to such a configuration, the degree of freedom of the design layout can be increased more than that of the configuration in Embodiment 2, so that miniaturization of the semiconductor device can be expected.

When the control pattern 32c is disposed at an end of another circuit pattern 32, such as the collector pattern 32a, as in Embodiment 3, the likelihood of the control wire 34 being electrically connected to the other circuit pattern 32 can be reduced.

Embodiment 4

Figure 8:
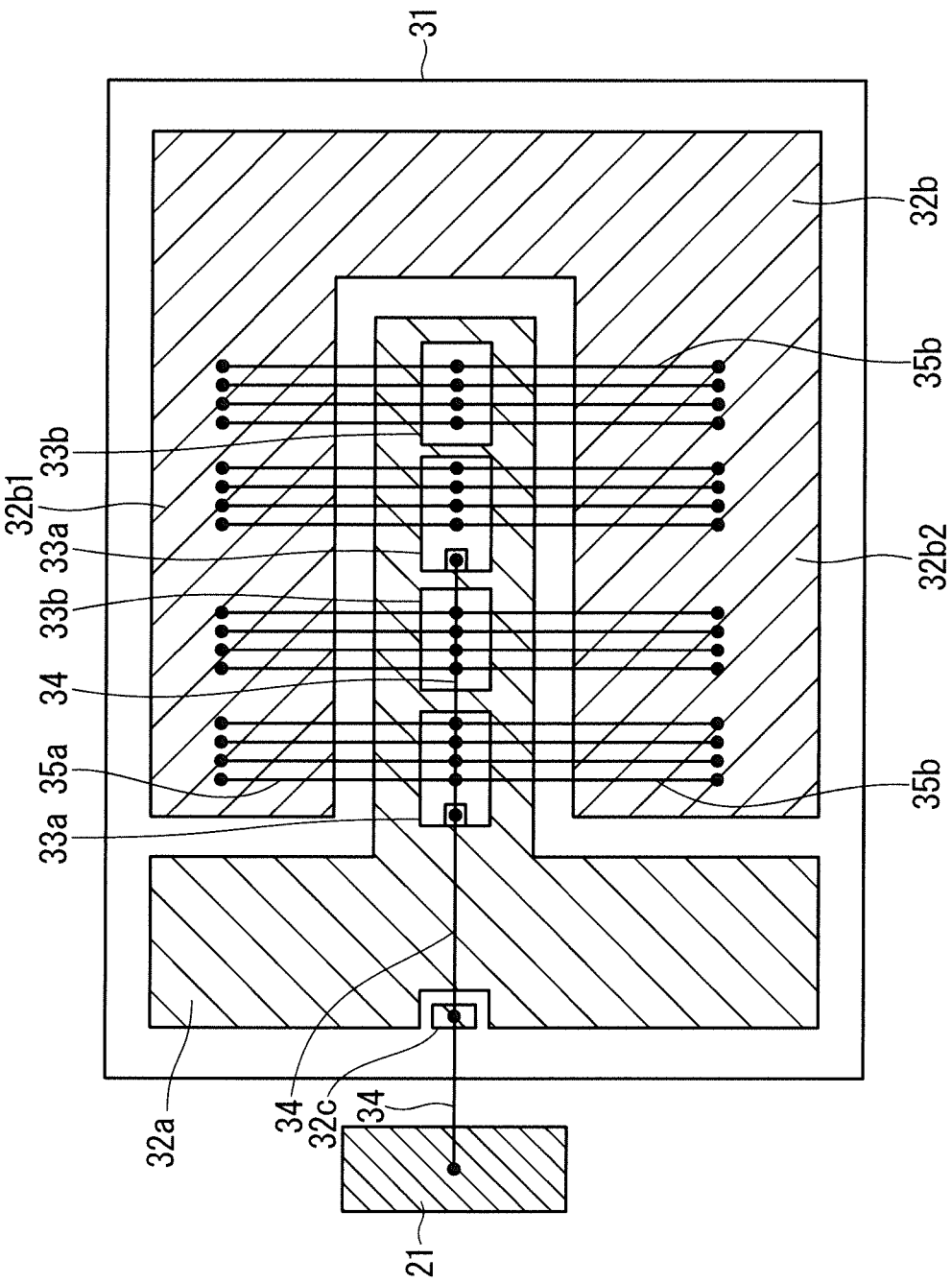
FIG. 8 is a plan view illustrating a configuration of a semiconductor device according to Embodiment 4.
Figure 9:
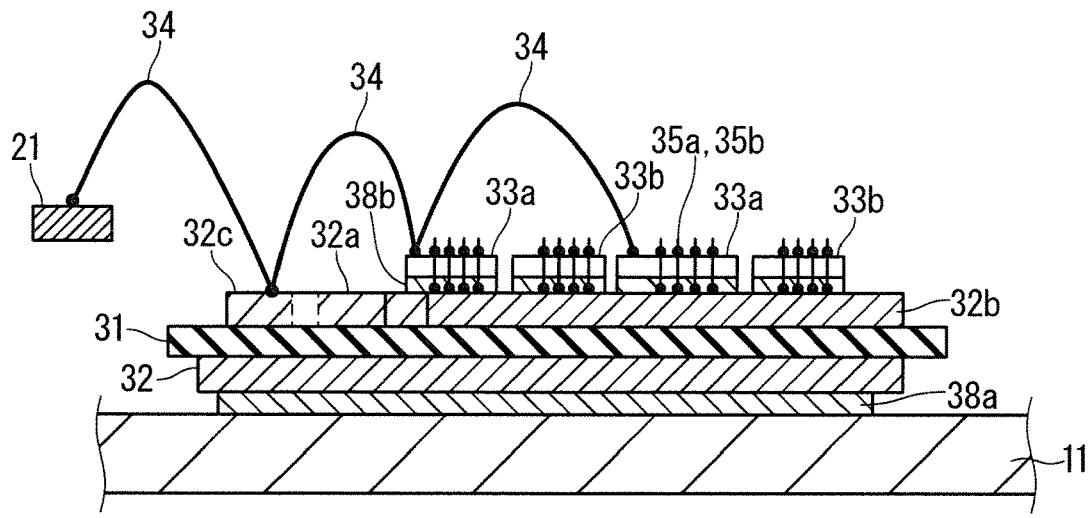
FIG. 9 is a side view illustrating a configuration of the semiconductor device according to Embodiment 4.

FIG. 8 is a plan view illustrating a configuration of a semiconductor device according to Embodiment 4, and corresponds to FIG. 2. FIG. 9 is a side view illustrating a configuration of the semiconductor device according to Embodiment 4, and corresponds to FIG. 3.

As illustrated in FIG. 9, the control wire 34 between control electrodes of the plurality of first semiconductor elements 33a is stitch-bonded to the control electrodes in Embodiment 4. Thus, in Embodiment 4, the plurality of first semiconductor elements 33a are not provided with respective control wires 34, but provided with a single control wire 34. The control wire 34 is only required to be stitch-bonded to one or more control electrodes. According to the semiconductor device according to Embodiment 4 as described above, wiring with the control wire 34 is easy.

As illustrated in FIG. 8, the control wire 34 passes above between an end of the first emitter wire 35a remote from the second emitter wire 35b and an end of the second emitter wire 35b remote from the first emitter wire 35a in Embodiment 4. According to such a configuration, wiring with the control wire 34 is easy. When the first emitter wire 35a and the second emitter wire 35b are separated from each other in contrast to the example of FIG. 8, the control wire 34 may pass above a portion between the first emitter wire 35a and the second emitter wire 35b.

Embodiment 5

Figure 10:
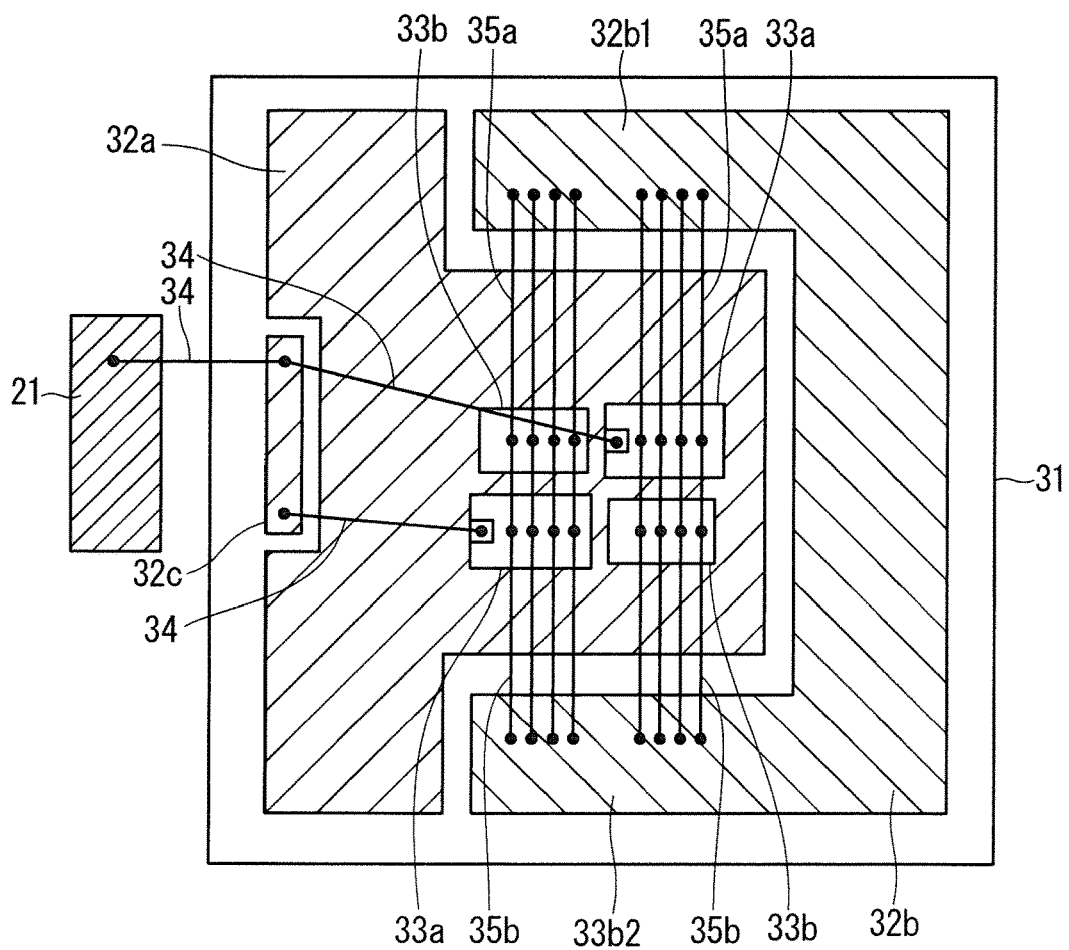
FIG. 10 is a plan view illustrating a configuration of a semiconductor device according to Embodiment 5.

FIG. 10 is a plan view illustrating a configuration of a semiconductor device according to Embodiment 5, and corresponds to FIG. 2.

As illustrated in FIG. 10, the second semiconductor element 33b is connected to the first emitter wire 35a between the first semiconductor element 33a and the first opposing portion 32b1 or to the second emitter wire 35b between the first semiconductor element 33a and the second opposing portion 32b2 in Embodiment 5.

According to the semiconductor device according to Embodiment 5 as described above, the first semiconductor element 33a and the second semiconductor element 33b share the first emitter wire 35a or the second emitter wire 35b. The number of wires of the semiconductor device as a whole can thereby be reduced, so that miniaturization or an increase in capacity of the semiconductor device can be expected.

Embodiment 6

Figure 11:
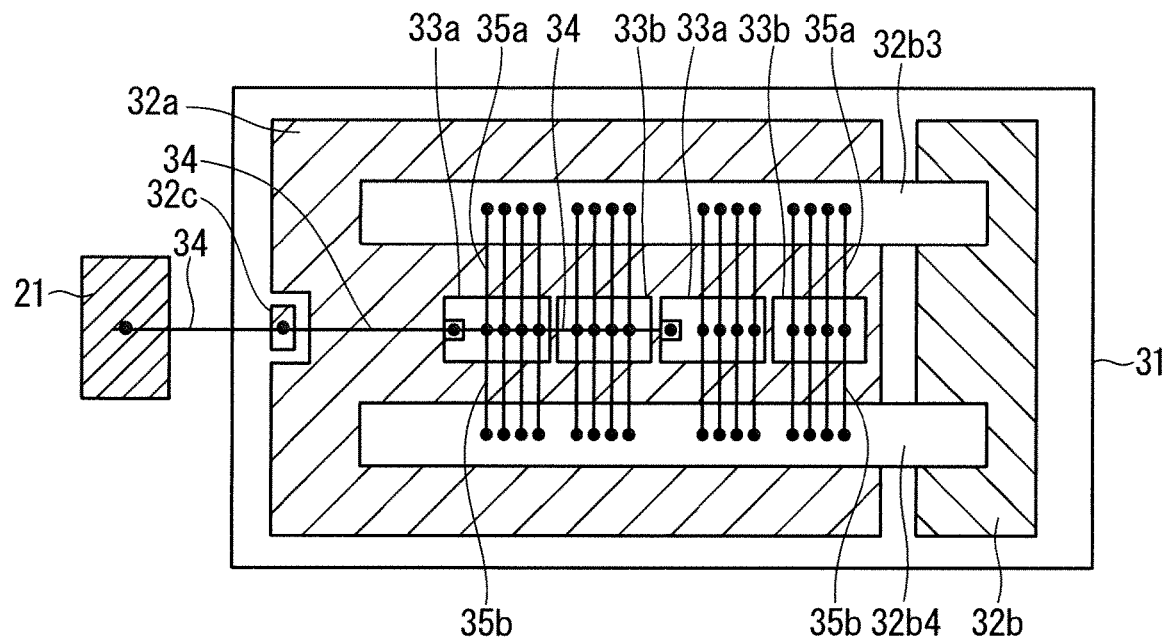
FIG. 11 is a plan view illustrating a configuration of a semiconductor device according to Embodiment 6.
Figure 12:
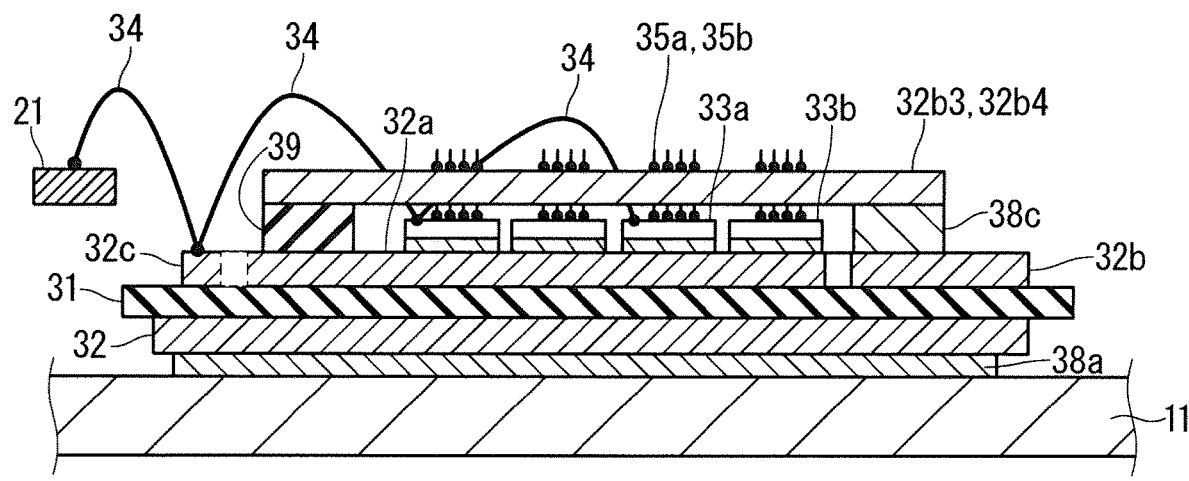
FIG. 12 is a side view illustrating a configuration of the semiconductor device according to Embodiment 6.

FIG. 11 is a plan view illustrating a configuration of a semiconductor device according to Embodiment 6, and corresponds to FIG. 2. FIG. 12 is a side view illustrating a configuration of the semiconductor device according to Embodiment 6, and corresponds to FIG. 3.

The conductive member according to each of Embodiments 1 to 5 is the emitter pattern 32b including the first opposing portion 32b1 and the second opposing portion 32b2. In contrast, the conductive member according to Embodiment 6 includes an emitter pattern 32b not including the first opposing portion 32b1 and the second opposing portion 32b2, a first copper block 32b3, and a second copper block 32b4 as illustrated in FIGS. 11 and 12.

Figure 13:
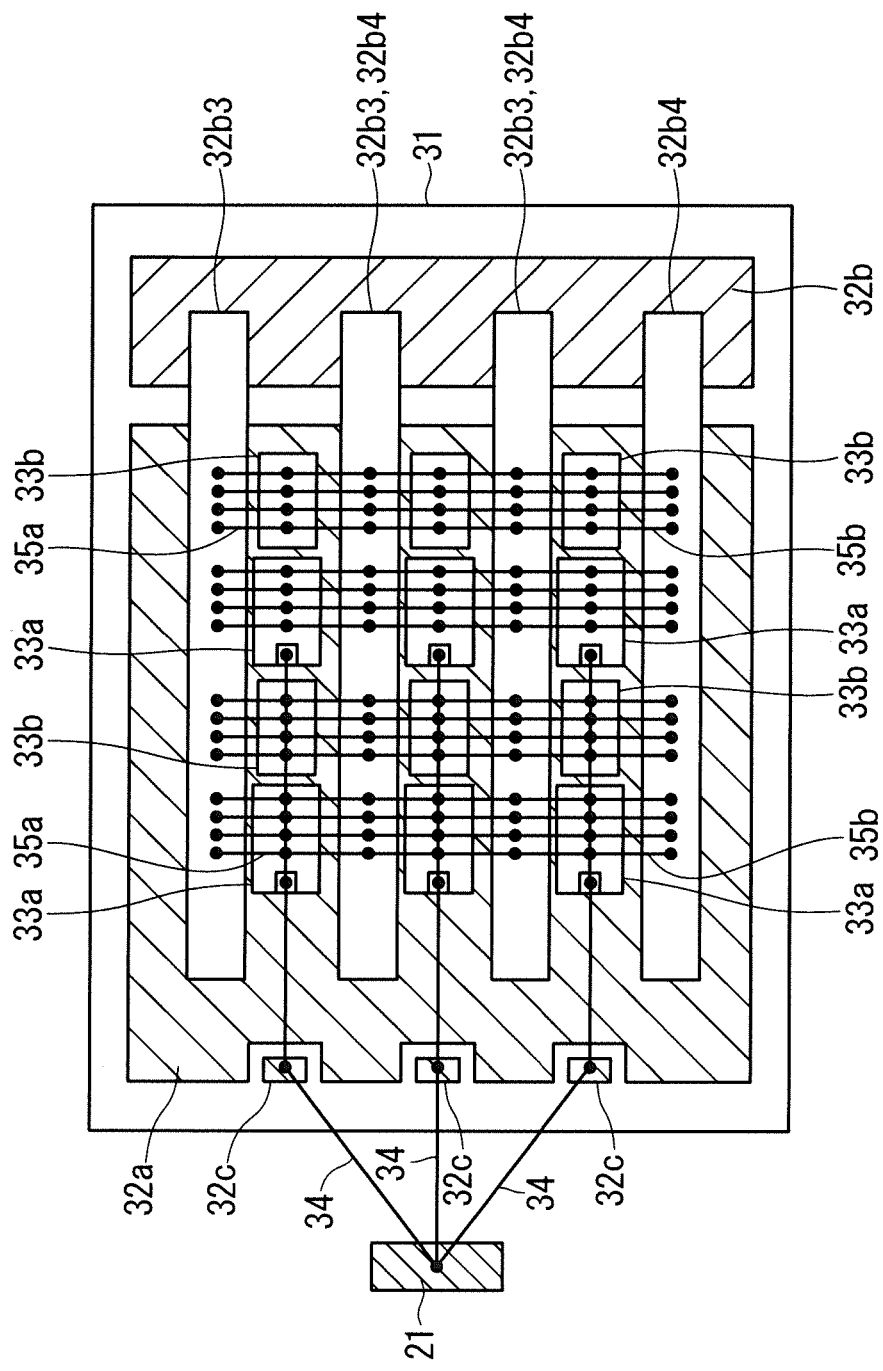
FIG. 13 is a plan view illustrating a configuration of the semiconductor device according to Embodiment 6.

As illustrated in FIG. 12, the first copper block 32b3 and the second copper block 32b4 respectively correspond to the first opposing portion 32b1 and the second opposing portion 32b2, and are arranged on the emitter pattern 32b through solder 38c. When the first copper block 32b3 and the second copper block 32b4 cannot be supported only by the solder 38c, an insulating member 39 may be disposed between the collector pattern 32a and each of the first copper block 32b3 and the second copper block 32*b*4 as illustrated in FIG. 12. As illustrated in FIG. 13, a plurality of first copper blocks 32*b*3 and a plurality of second copper blocks 32*b*4 may be arranged.

According to the semiconductor device according to Embodiment 6 as described above, the emitter pattern 32*b* not including the first opposing portion 32*b*1 and the second opposing portion 32*b*2 can be used. This can reduce a space for insulation between the first semiconductor element 33*a* and each of the first opposing portion 32*b*1 and the second opposing portion 32*b*2 in plan view, so that the semiconductor device can be miniaturized.

Embodiment 7

Figure 14:
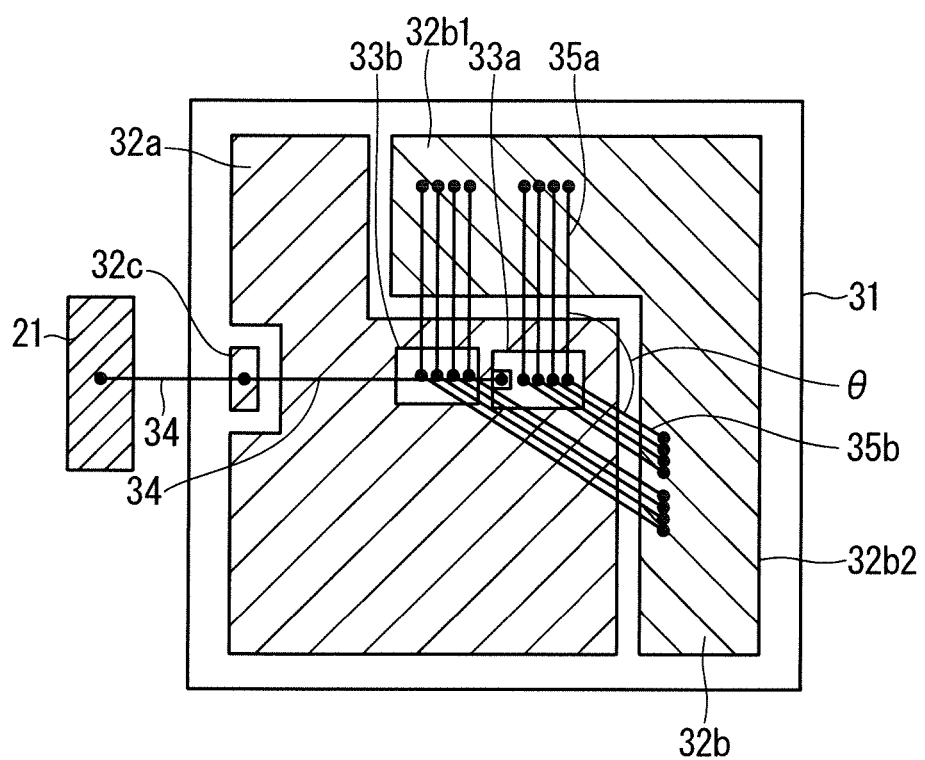
FIG. 14 is a plan view illustrating a configuration of a semiconductor device according to Embodiment 7.

FIG. 14 is a plan view illustrating a configuration of a semiconductor device according to Embodiment 7, and corresponds to FIG. 2.

In each of Embodiments 1 and 6, the second opposing portion 32*b*2 is located directly opposite the first opposing portion 32*b*1 with respect to the first semiconductor element 33*a* in plan view. The direction of extension of the first emitter wire 35*a* and the direction of extension of the second emitter wire 35*b* form the straight angle in plan view.

In contrast, as illustrated in FIG. 14, the second opposing portion 32*b*2 is offset from the location directly opposite the first opposing portion 32*b*1 with respect to the first semiconductor element 33*a* in Embodiment 7. The direction of extension of the first emitter wire 35*a* and the direction of extension of the second emitter wire 35*b* form an obtuse angle, and an angle θ between them is more than 90° and less than 180°.

According to the semiconductor device according to Embodiment 7 as described above, the degree of freedom of the design layout can be increased without impairing reliability of wiring, so that miniaturization or an increase in capacity of the semiconductor device can be expected.

Embodiment 8

In Embodiment 8, at least one of the first semiconductor element 33*a* and the second semiconductor element 33*b* includes a wide bandgap semiconductor. The wide bandgap semiconductor includes silicon carbide (SiC), gallium nitride (GaN), and diamond, for example. According to Embodiment 8 as described above, miniaturization and parallelization of the semiconductor device can be expected.

Embodiments and modifications can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an insulating substrate;
a first semiconductor element connected to the insulating substrate;
a conductive member disposed on the insulating substrate, and including a first opposing portion continuously electrically connected to a second opposing portion located opposite each other with respect to the first semiconductor element in plan view;
a first wire connected to the first semiconductor element and the first opposing portion; and
a second wire connected to the first semiconductor element and the second opposing portion, and located opposite the first wire with respect to a connection point in plan view, the connection point being a point where the first wire and the first semiconductor element are connected to each other.

2. The semiconductor device according to claim 1, wherein
the first semiconductor element, the first wire, and the second wire respectively comprise a plurality of first semiconductor elements, a plurality of first wires, and a plurality of second wires, and
the plurality of first semiconductor elements are connected in parallel with one another with the plurality of first wires, the plurality of second wires, and the conductive member.

3. The semiconductor device according to claim 2, wherein
a control wire between control electrodes of the plurality of first semiconductor elements is stitch-bonded to the control electrodes.

4. The semiconductor device according to claim 1, further comprising:
an external control terminal connected to an exterior of the semiconductor device; and
a control pattern disposed on the insulating substrate, and connected only to a control wire between the external control terminal and the first semiconductor element.

5. The semiconductor device according to claim 1, further comprising
a second semiconductor element disposed on the insulating substrate, and connected to the first wire between the first semiconductor element and the first opposing portion or to the second wire between the first semiconductor element and the second opposing portion.

6. The semiconductor device according to claim 1, wherein
the conductive member includes:
an emitter pattern disposed on the insulating substrate; and
a first copper block and a second copper block arranged on the emitter pattern, and respectively corresponding to the first opposing portion and the second opposing portion.

7. The semiconductor device according to claim 1, wherein
a direction of extension of the first wire and a direction of extension of the second wire form an obtuse angle in plan view.

8. The semiconductor device according to claim 1, wherein
the first semiconductor element comprises a wide bandgap semiconductor.

9. A semiconductor device comprising:
an insulating substrate;
a first semiconductor element connected to the insulating substrate;
a conductive member disposed on the insulating substrate, and including a first opposing portion and a second opposing portion located opposite each other with respect to the first semiconductor element in plan view and electrically connected to each other;
a first wire connected to the first semiconductor element and the first opposing portion; and a second wire connected to the first semiconductor element and the second opposing portion, and located opposite the first wire with respect to a connection point in plan view, the connection point being a point where the first wire and the first semiconductor element are connected to each other, wherein the first semiconductor element, the first wire, and the second wire respectively comprise a plurality of first semiconductor elements, a plurality of first wires, and a plurality of second wires, the plurality of first semiconductor elements are connected in parallel with one another with the plurality of first wires, the plurality of second wires, and the conductive member, and a control wire connected to the first semiconductor element passes above between an end of the first wire remote from the second wire and an end of the second wire remote from the first wire.

10. A semiconductor device comprising:
an insulating substrate;
a first semiconductor element connected to the insulating substrate;
a conductive member disposed on the insulating substrate, and including a first opposing portion and a second opposing portion located opposite each other with respect to the first semiconductor element in plan view and electrically connected to each other to fix the first and second opposing portions at a same potential;
a first wire connected to the first semiconductor element and the first opposing portion; and
a second wire connected to the first semiconductor element and the second opposing portion, and located opposite the first wire with respect to a connection point in plan view, the connection point being a point where the first wire and the first semiconductor element are connected to each other.

* * * * *